United States Patent [19]
Jacobs et al.

[11] Patent Number: 5,563,591
[45] Date of Patent: Oct. 8, 1996

[54] PROGRAMMABLE ENCODER USING AN ADDRESSABLE DISPLAY

[75] Inventors: Kurt L. Jacobs, Fairport; Hugh L. Fuller, Rochester; Frederick A. Donahue, Walworth, all of N.Y.

[73] Assignee: Xerox Corporation, Stamford, Conn.

[21] Appl. No.: 323,409

[22] Filed: Oct. 14, 1994

[51] Int. Cl.⁶ ........................................ H03M 1/22
[52] U.S. Cl. ................................ 341/13; 347/37
[58] Field of Search ........................ 341/3, 6, 8, 11, 341/13, 99; 347/37

[56] References Cited

U.S. PATENT DOCUMENTS

| | | | |
|---|---|---|---|
| 4,786,803 | 11/1988 | Majette et al. | 341/13 |
| 4,789,874 | 12/1988 | Majette et al. | 250/231 SE |
| 5,187,479 | 2/1993 | Johnson, III et al. | 341/6 |
| 5,206,645 | 4/1993 | Urich | 341/11 |
| 5,254,919 | 10/1993 | Bridges et al. | 318/560 |

*Primary Examiner*—Marc S. Hoff
*Attorney, Agent, or Firm*—Daniel J. Krieger

[57] ABSTRACT

A programmable encoder having an addressable display device to display an encoder pattern of fiducial marks. The programmable encoder can be programmed to display an encoder pattern on a liquid crystal display. A sensor senses the marks on the pattern and generates sensor signals indicative of the sensed pattern. A controller connected to the sensor receives the sensor signals and outputs control signals which control the movement of a machine, such as an ink jet printer. The programmable encoder can be programmed to display any number of patterns on the addressable display device, and consequently, is highly adaptable to any number of applications requiring position, speed, or acceleration control.

38 Claims, 5 Drawing Sheets

1

PROGRAMMABLE ENCODER USING AN ADDRESSABLE DISPLAY

FIELD OF THE INVENTION

The present invention relates generally to an apparatus and method for determining the position of a moving component and more particularly to a single channel encoder which is programmable for use in a printing apparatus.

BACKGROUND OF THE INVENTION

An ink jet printer of the type referred generally to as a drop-on-demand printer has at least one printhead from which droplets of ink are directed towards a recording medium. Within the printhead, the ink is contained in a plurality of channels in which energy pulses are used to cause the droplets of ink to be expelled, as required, from orifices or nozzles at the end of the channels.

In a thermal ink-jet printer, the energy pulses are usually produced by resistors each located in each one of the respective channels and individually addressable by current pulses to heat and vaporize ink in the channels. A thermal energy generator, usually a resistor or a heater, is located in each of the channels, a predetermined distance from the nozzles. The resistors are individually addressed with a current pulse to momentarily vaporize the ink thereby forming a bubble which expels an ink droplet. As the bubble grows, the ink which bulges from the nozzles, is contained by the surface tension of the ink as a meniscus. As the bubble begins to collapse, the ink remaining in the channel between the nozzle and the bubble move towards the collapsing bubble causing a volumetric contraction of the ink at the nozzle resulting in the separation of the bulging ink as a droplet. The acceleration of the ink out of the nozzle while the bubble is growing provides the momentum and velocity of the droplet in a substantially straight line direction towards the recording medium. The droplet of ink lands on the recording medium and forms an ink spot. Because the droplet of ink is emitted only when the resistor is actuated, this type of ink jet printing is known as drop-on-demand printing. The channel is then refilled with ink by capillary action, which, in turn, draws ink from a supply container. Operation of a thermal ink-jet printer is described in, for example, U.S. Pat No. 4,849,774.

One particular form of ink jet printer is described in U.S. Pat. No. 4,638,337. The described printer is of the carriage type and has a plurality of printheads each having its own supply cartridge mounted on a reciprocating carriage. The nozzles in each printhead are aligned perpendicularly to the line of movement of the carriage and a swath of information is printed on the stationary recording medium as the carriage is moved in one direction. The recording medium is then stepped perpendicularly to the line of carriage movement by a distance equal to the width of the printed swath. The carriage is then moved in the reverse direction to print another swath of information. Full width or page width linear arrays in which the sheet is moved past a linear array of nozzles extending across the full width of the sheet, are also known.

In a typical ink-jet printing machine, the carriage must transport the printhead assembly across the page for printing and must also move the carriage to predetermined locations for capping, priming, and other maintenance functions for the printhead and the printhead nozzles thereof. In each of these instances, the carriage is moved across the recording medium in a controlled fashion or is parked at the predetermined locations along the carriage rails. A carriage motor and electronic controller are provided to precisely position the carriage at these locations. Since a motor is typically used, the rotary motion of the motor, is converted to the linear motion of the carriage by among others, a toothed belt/pulley, a cable/capstan or a lead screw. In addition to these devices, which move the carriage in a linear fashion, the linear motion is controlled and/or kept track of by an encoder.

Linear and rotary encoders are used for positioning and timing of movable members. In linear encoders, a linear strip of material includes a plurality of markings called fiducial markings, which are typically illuminated by a source of light and detected by an optical sensor to determine positioning and timing. The optical sensor detects the fiducial markings and generates a series of electrical pulses which are transmitted to a control system for controlling the motion of a movable member, such as a printhead carriage. The linear strip of fiducial markings is mounted on the printer parallel to the anticipated path of the carriage as it traverses across the recording medium. The light source and sensor are mounted on the carriage so that as the carriage reciprocates back and forth across the recording medium the combination light source/sensor can illuminate and detect the fiducial markings on the encoder strip for controlling the motion of the printhead carriage.

Rotary encoders use a disk coupled to a rotating member in which the disk includes a plurality of spaced marks. The marks are arranged on the disk so that as the marks rotate with the rotating member an illumination source/sensor senses the marks for determining the position, velocity and acceleration the rotating member. The illuminating source and the sensor can be disposed on opposite sides of the rotating disk to sense the passage of marks if the disk is transparent to light. In this way, a pulse is generated for each increment between adjacent marks of the disk.

In both the linear strip and disk encoders, the fiducial markings are typically spaced a predetermined distance apart related to a printing resolution for controlling the motion of the moving member. These fiducial marks are typically produced via a photographic or etching process. Once the strip or disk has been made, the encoder strip or disk is mounted on a support member such as a stationary platform, as in the case of monitoring the position of a printhead carriage, or a moving platform when the disk is mounted on the rotating member. Because it is desirable to accurately control the motion and/or position of the moving member, accurate placement of the encoder strip or disk is critical. Consequently, the encoder strip or disk must be positioned accurately on the support member or the member which is to be controlled. Typically, the positioning of the strip or disk must be made to a fairly tight tolerance to assure accurate control of the moving member.

Various encoders and methods for controlling the positioning of movable members are illustrated and described in the following disclosures which may be relevant to certain aspects of the present invention.

U.S. Pat. No. 5,187,479 to Johnson, III, et al., describes a circuit for compensating the backlash of a shaft on an incremental encoder having a quadrature and index pulse output lines. The circuit conditions electrical signals from an incremental encoder when the encoder's shaft is induced to rotate in a direction counter to the normal operation of the equipment being controlled.

U.S. Pat. No. 5,206,645 to Urich describes an apparatus for generating a pulse train in which the apparatus includes a member having a plurality of spaced marks disposed thereon with at least one of the spaced marks being a reference mark. The pulse train has a periodicity defined by the same edge of two successive pulses and the plurality of spaced marks are configured so that the periodicity of the pulse train remains constant.

U.S. Pat. No. 5,254,919 to Bridges et al. describes an encoder system having an encoder element driven by a motor with a series of segments arranged along a path. Adjacent segments having different properties meet at an edge or transition. Two adjacent segments of different properties comprise a cycle and the encoder element having a number of cycles equally spaced along the path define a relatively course pitch relationship.

SUMMARY OF THE INVENTION

In accordance with one aspect of the present invention, there is provided a programmable encoder having an addressable display having a display input for receiving pattern signals to cause the addressable display to display a pattern formed according to the signals, a sensor spaced from the addressable display having a sensor output for transmitting sensor signals and a controller having a controller input coupled to the sensor output and a controller output with the controller input receiving the sensor signals and the controller output outputting control signals based on the sensor signals.

Pursuant to another aspect of the invention, there is provided a method for controlling the motion of a movable member. The method includes displaying a pattern with an addressable display, scanning the pattern displayed on the addressable display device with a sensor, generating signals according to the scanned pattern and generating a control signal based on the generated signals.

An additional aspect of the invention provides for a printing apparatus having a movable member and a programmable encoder determining the position of the movable member in which the programmable encoder includes an addressable display spaced from the movable member.

While the present invention will be described in connection with a preferred embodiment thereof and method of use, it will be understood that it is not intended to limit the invention to that embodiment and method of use. On the contrary, it is intended to cover all alternatives, modifications, and equivalents as may be included within the spirit and scope of the invention as defined by the appended claims.

DETAILED DESCRIPTION OF THE INVENTION

Figure 1:
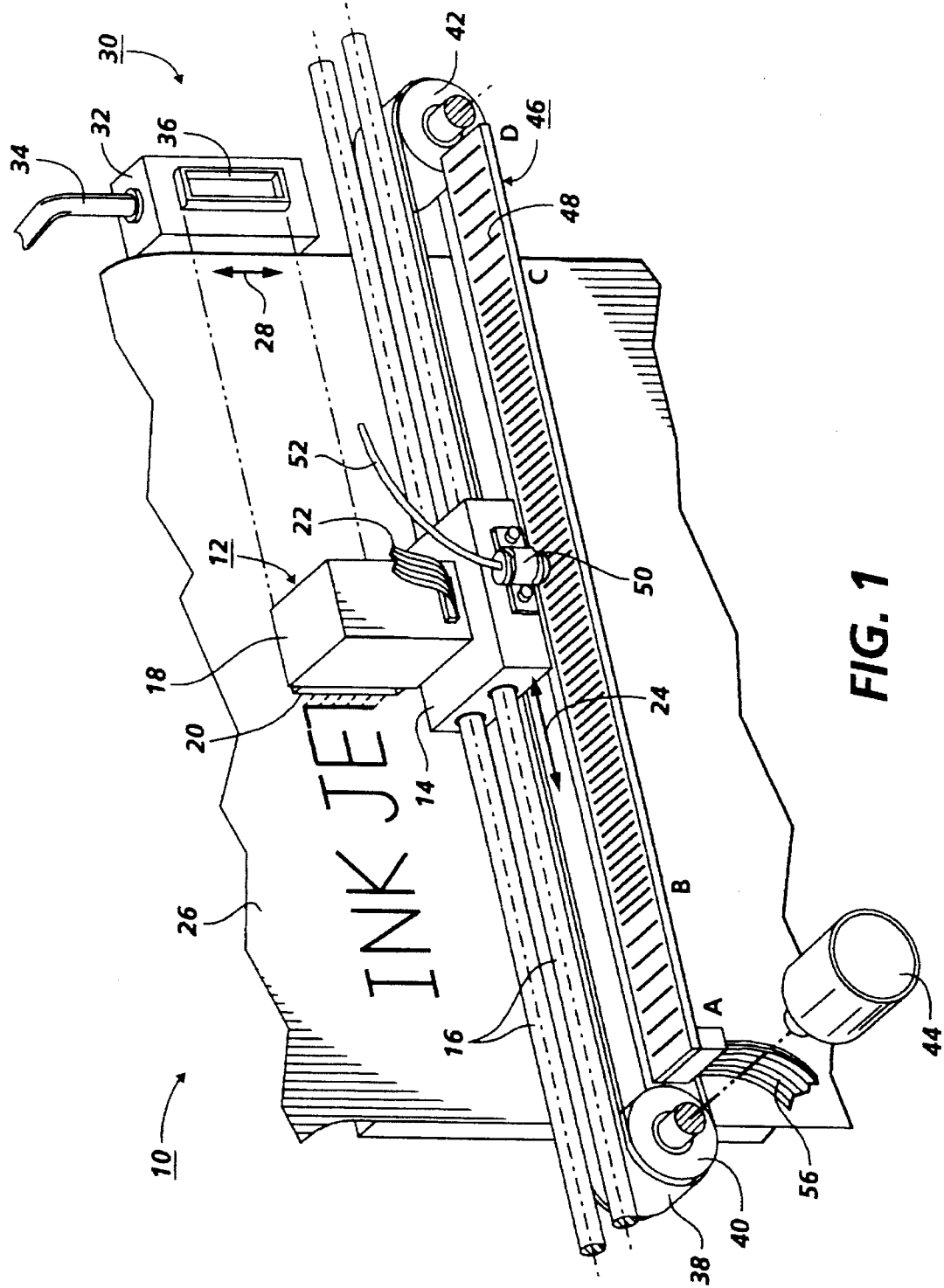
FIG. 1 is a partial schematic perspective view of an ink jet printer incorporating a programmable encoder.

FIG. 1 illustrates a partial schematic perspective view of an ink-jet printer 10 having an ink-jet printhead cartridge 12 mounted on a carriage 14 supported by carriage rails 16. The printhead cartridge 12 includes a housing 18 containing ink for supply to a thermal ink jet printhead 20 which selectively expels droplets of ink under control of electrical signals received from a controller of the printer 10 through an electrical cable 22. The printhead 20 contains a plurality of ink channels (not shown) which carry ink from the housing 18 to respective ink ejecting orifices or nozzles (also not shown). When printing, the carriage 14 reciprocates or scans back and forth along the carriage rails 16 in the direction of the arrow 24. As the printhead cartridge 12 reciprocates back and forth across a recording medium 26, such as a sheet of paper or a transparency, droplets of ink are expelled from selected ones of the printhead nozzles towards the sheet of paper 26. The ink ejecting orifices or nozzles are typically arranged in a linear array perpendicular to the scanning direction 24. During each pass of the carriage 14, the recording medium 26 is held in a stationary position. At the end of each pass, however, the recording medium is stepped in the direction of an arrow 28. For a more detailed explanation of the printhead and printing thereby refer to U.S. Pat. No. 4,571,599 and U.S. Pat. No. Re. 32,572, the relevant portions of which are incorporated herein by reference.

At one side of the printer 10, outside a printing zone which encompasses the width of the recording medium 26, is a maintenance station 30, a portion thereof which is illustrated. At the end of a printing operation, or at other times when necessary, the printhead carriage 14 is parked in a maintenance position confronting the maintenance station 30 which includes a chamber 32 to which a suction device is connected or through which a vacuum is applied through a vacuum line 34. The chamber 32 has attached thereto a maintenance/priming element 36 which contacts the printhead 20 when the carriage is located in the maintenance station position. During a priming operation, a vacuum pump (not shown) applies a vacuum to the vacuum line 34 through a waste tank (not shown) for removing from ink or debris and/or maintaining the ink-jet nozzles of the printhead 20. The maintenance/priming element 36, in contact with the printhead 20, maintains an airtight seal around the printhead nozzles for withdrawing ink or debris from the nozzles. U.S. Pat. No. 5,210,550 describes a maintenance station for ink-jet printers in more detail, the relevant portions of which are incorporated herein by reference.

The carriage 14 is moved back and forth in the scanning direction 24 by a belt 38 attached thereto. The belt 38 is driven by a first rotatable pulley 40 and a second rotatable pulley 42. The first rotatable pulley 40 is, in turn, driven by a reversible motor 44 under control of the controller of the ink-jet printer. In addition to the toothed belt/pulley system for causing the carriage to move, it is also possible to control the motion of the carriage by using a cable/capstan, lead screw or other mechanisms as known by those skilled in the art.

Figure 2:
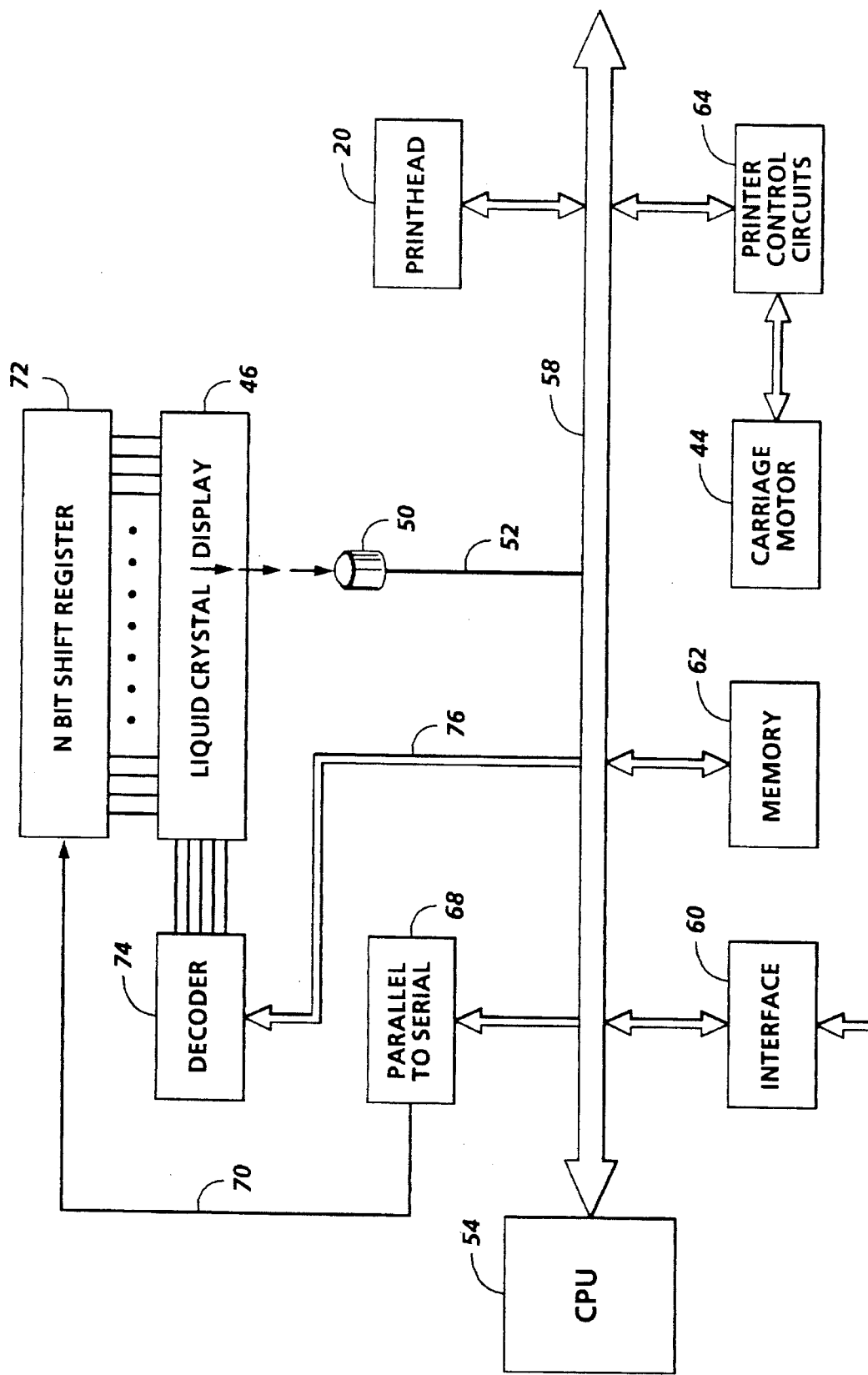
FIG. 2 is a block diagram of an electronic circuit for an ink jet printer incorporating a programmable encoder.

To control the movement and/or position of the carriage 14 along the carriage rails 16, the present invention includes an encoder having an addressable display device 46 which displays a series of programmed fiducial marks in a pattern 48. The pattern 48 is sensed by a sensor 50, such as a photodiode, attached to the printhead carriage 14. The sensor 50 includes a cable 52 which transmits electrical signals representing the sensed fiducial marks of the pattern 48 to a central processing unit (CPU) 54 as illustrated in FIG. 2. The addressable display device 46 of the present invention replaces a linear strip of photographically or mechanically reproduced fiducial marks. By using an addressable display device, such as a liquid crystal display (LCD), the present invention includes an encoder which can be programmed with different resolutions and having fiducial marks of different lengths, widths, or locations. Other addressable displays include electroluminescent displays, light emitting diode displays, and TFT LCD's. Display of bar codes having lines of unequal widths is also possible. The liquid crystal display 46 can include a display having a two by two array (dot matrix) of individually addressed pixels or a display having a linear array of vertical segments. The liquid crystal display 46 includes a cable 56 (FIG. 1) for carrying electrical signals to generate a pattern for display. The liquid crystal display 46 is mounted in a stationary portion of the frame of the printer 10.

FIG. 2 is a block diagram of an electronic circuit for an ink-jet printer incorporating a programmable encoder for controlling the movement of the printhead carriage 14. As illustrated in FIG. 2, the central processing unit 54 is connected through a bus 58 to an interface 60 which is, in turn, connected to any number of external devices for inputting information to the central processing unit 54. One such input device might include a keypad in which an operator enters keystrokes for selecting certain patterns to be displayed on the liquid crystal display 46. The CPU 54 is also connected to a memory 62 which might include both read-only memory (ROM) or random-access memory (RAM). The read-only memory might include an operating program for the CPU 54 as well as preprogrammed fiducial markings for display on the liquid crystal display 46. The random access memory might include accessible memory including print buffers for the manipulation of data and for the storage of printing information in the form of bitmaps received from an input device connected to the interface 60. In addition to the memory 62, various printer control circuits 64 are connected to the bus 58 for operation of the printer which include paper feed driver circuits and printhead control circuits as is known by those skilled in the art. Certain printer control circuits are also used for driving the carriage through control of a carriage motor 44 here coupled to the printer control circuits 64.

The printhead 20 is also controlled by the CPU 54 according to the content of signals received over the bus 58 and sent to various printer control circuits 64. The printer control circuits 64 control the ejection of inks from the nozzles of the printhead 20.

Control of the carriage motor 44 is accomplished by commands generated by the central processing unit 54 in response to signals transmitted from the sensor 50 over the conductor 52. It is also possible to have a controller separate from the CPU of the printer 10 to operate with the sensor 50 and the addressable display 46 which operates as a separate encoder apart from the functions of the CPU 54. As the carriage motor 44 moves the belt 38 by the action of the rotatable pulleys 40 and 42, the movement and the position of the carriage 14 is sensed by the sensor 50 which scans along the pattern 48 displayed by the liquid crystal display 46.

The liquid crystal display 46 can be programmed to display a multitude of patterns having fiducial marks arranged in any sequence. The CPU 54 can be programmed to select preprogrammed patterns stored in the memory 62, which are then displayed on the liquid crystal display 46. In addition, the CPU 54 can be programmed to generate patterns upon receiving the appropriate signals over the bus 58 from the interface 60 which has been attached to a computer or other input devices. The CPU 54 can also be programmed to generate patterns for display on the LCD 46 to the content of images to be printed.

The patterns which are either stored in ROM or which are generated by the CPU 54 and stored in RAM typically consist of a bitmap of an image consisting of 1s and 0s arranged in columns and rows. For the present discussion, a 1 indicates that a pixel on the liquid crystal display should be lit. Once the pattern for display on the liquid crystal display 46 has been selected, a parallel to serial conversion circuit 68 takes parallel information from the stored bitmap and serializes it for transmission over a conductor 70 coupled to an N- bit shift register 72. The N-bit shift register 72 takes the serialized information and addresses each column of the LCD display 46. A decoder 74 coupled to the bus 58 through a conductor 76 is used to select individual rows of the liquid crystal display 46 so that adjacent rows of the liquid crystal display 46 are successively addressed to thereby cause the information contained in the N bit shift register 72 which is continually updated to form a pattern on the liquid crystal display 46.

The programmable pattern 48 displayed on the liquid crystal display 46 of FIG. 1 illustrates some of the advantages of the present invention. For instance, the present invention allows for dynamic resolution changes of the pattern 48 displayed during printing. For example, the carriage 14 is moved from position A to position B using coarse fiducial marks or marks which are spaced widely apart. The wide spacing of the marks allows for the carriage 14 to be moved fairly rapidly from point A to point B since not as many of the fiducial marks need to be read. The course encoder fiducial marks could be initially displayed and used to move the printhead carriage 14 to a position along the recording medium 26. Once the carriage 14 is located along the carriage rails 16 at the specified position the pattern displayed on the LCD 46 is changed to include a pattern such as that illustrated from point B to point C. These finely or narrowly spaced fiducial marks could be arranged at a preselected spacing which corresponds to the printing density of an image to be printed by the printhead 20. For instance, if 300 spots per inch are being printed on the recording medium 26, the spacing of marks shown between B and C could also be spaced to correspond to a density of 300 spots per inch. Likewise, if printing density changes during the course of printing on the recording medium or changes from one recording medium to the next, the spacing of fiducial marks from point B to C could be spaced so that other spacings, such as 600 dots per inch, could be performed.

Figure 3:
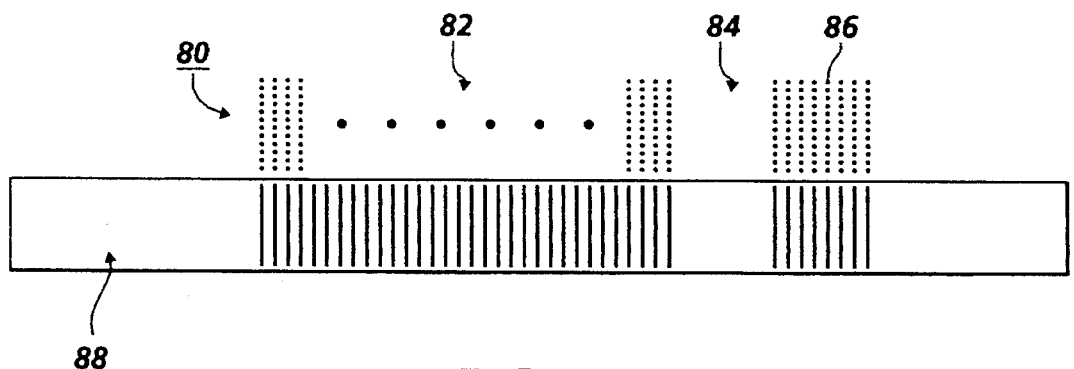
FIG. 3 is a schematic illustration of a printed image and a pattern displayed on a programmable display device of a programmable encoder.

In addition to being able to dynamically change the resolution of printing by changing the pattern displayed on the LCD 46, the present invention also allows for dynamically controlling the movement of the carriage 14 according to the content of the image being recorded on the recording medium 26. For instance, as illustrated in FIG. 3, an image 80 to be printed on the recording medium includes a first portion 82 of printing followed by a second portion 84 of white space, followed by a third portion 86 of printing. Typically, an image containing white space 84 is traversed by the printhead carriage at the same speed that the printed areas 82 and 86 are traversed. In the present invention, however, the image bitmap which is to be printed upon a recording medium can be previewed for white space and if any white space is found, the programmable encoder can be programmed to accommodate the white space present in the printed image. By generating a pattern on the LCD 46 at areas corresponding to the printing areas 82 and 86 and not generating a pattern on the LCD at areas corresponding to the white space 84, the speed of the carriage can be increased to pass through the white space area at a speed greater than the speed through the printed areas. FIG. 3 illustrates the correspondence of the printed pattern 80 to a pattern 88 generated on the LCD 46 useful for printing in white space skipping.

Figure 4:
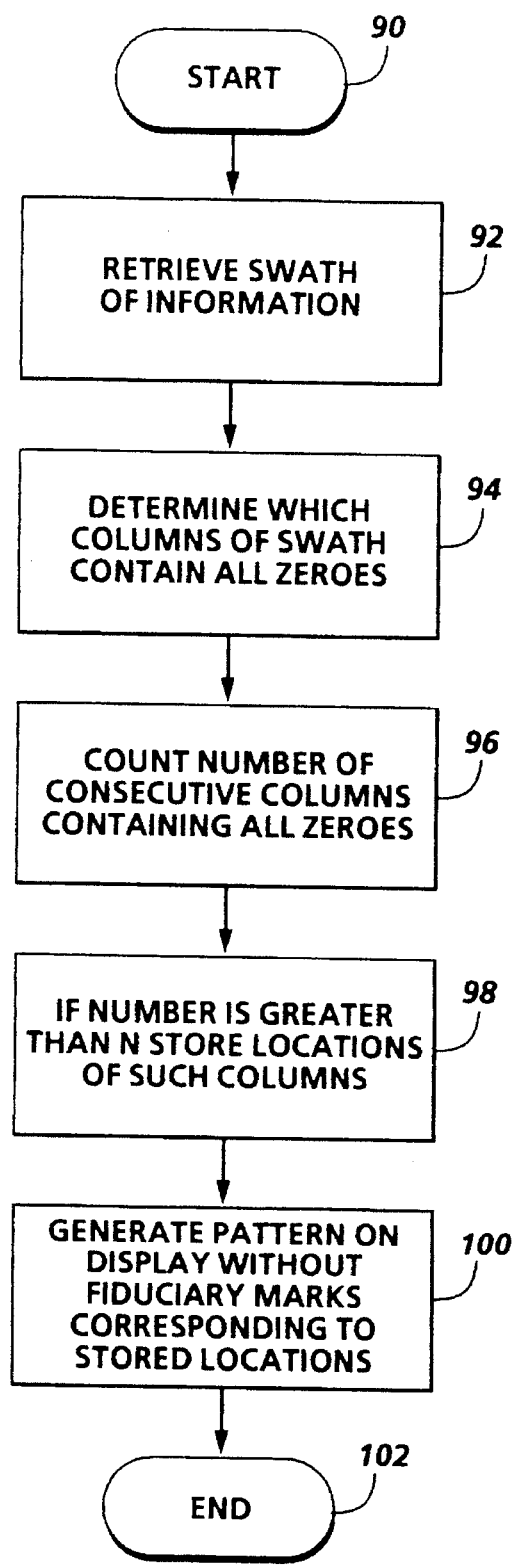
FIG. 4 is a flow diagram illustrating a method for generating the pattern displayed in FIG. 3.

To dynamically change the pattern displayed on the liquid crystal display 46 of a programmable encoder, the bitmap image containing information for directing which of the printhead nozzles eject ink upon the recording medium 26 must first be examined. Since printing is typically performed by printing a swath of information having a height equal to the height of the number of nozzles arranged on the printhead, a swath of information must first be retrieved from the bitmap image. As illustrated in the flow chart of FIG. 4, the central processing unit in conjunction with memory, operates as a pattern generating circuit and is programmed to start at step 90 by retrieving a swath of information from the bitmap image as shown at step 92. The swath of information would be stored in the random access memory at which point the CPU would, under control of a written program, determine which columns of the swath contain all zeros at step 94. (Zeros typically represent white space and ones typically represent a printed dot in a bitmap.) Once it has been determined which columns of the swath contain all zeros, a count is made to determine how many consecutive columns of the swath contain all zeros at step 96. A count of consecutive columns containing all zeros is made since, it is likely that, for instance, a white space of only two columns wide would not be sufficiently wide to efficiently speed up the motion of the printhead carriage. Consequently, a number N is chosen which is equal to the minimum number of columns for which white space skipping is to be performed. In step 98, if the number of consecutive columns containing all zeros is greater than N, then the location of such columns is stored in random access memory. These column locations are then used to generate a pattern on the liquid crystal display in which no fiduciary marks are displayed which correspond to white space as illustrated in step 100. At step 102, the analysis of one swath of information would be complete and an adjacent swath of information to be printed next would begin the process all over again at step 90. It is also possible to generate widely spaced fiducial marks on the LCD at the portion corresponding to white space to control the carriage.

Figure 5:
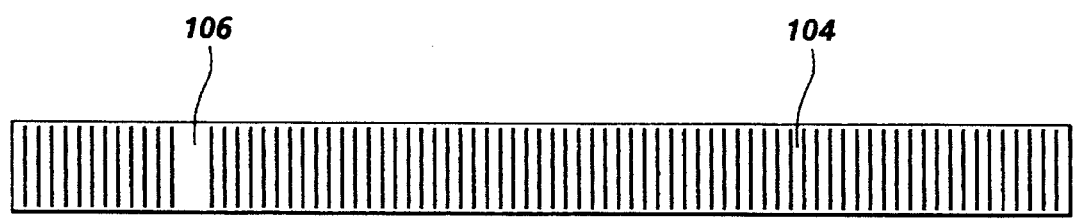
FIG. 5 is a schematic illustration of a pattern displayed on the programmable display device.

While it is possible to control printing density as illustrated in FIG. 1 and to control carriage motion or speed according to white space skipping as illustrated in FIG. 3, the ability to enable or disable fiducial marks on demand is an additional advantage of the present invention. For instance, as illustrated in FIG. 5, the pattern 104 contains a space 106 in which no fiducial marks are located. Such a pattern is generated when the sensor 50 is marginally positioned on the edge of a fiducial mark when a carriage transport is located at a stationary position. Due to the incorrect positioning of the sensor, oscillations which are introduced by vibration can be prevented by turning off a certain portion of the pattern 104 such as space 106.

The present invention not only allows for accurate control of carriage 14 motion but also enables the encoder to generate encoder pulses without any motion of the carriage. For instance, when the printhead 20 is located in the maintenance position in front of the maintenance station 30, it is often desirable to eject ink into the chamber 32 for priming or maintenance operations. Since the present invention allows for the encoder strip 46 to be programmed, the fiducial marks can be made to cycle past the sensor 50 while the carriage is stationary. By cycling the fiducial marks under the sensor 50 while stationary, it is possible to test various functions of the printhead 20 without moving the carriage. Such an encoder is called a bogus encoder.

Other advantages of the present invention include the elimination of accurate mechanical alignment of an encoder strip to the frame of a printer. Since the pattern of an encoded strip can now be programmed and displayed on an LCD, the mechanical alignment of the LCD to the printer itself is not as critical when compared to encoders using a premarked strip of fiducial marks. Once the liquid crystal display 46 is in place, the location of the carriage with respect to the carriage rail 16 can be aligned by simply generating a pattern on the LCD 46 aligned with the sensor. The ability to program the liquid crystal display 46 also eliminates accurate positioning of the sensor 50 on the carriage 14. Such programmability not only eliminates strict mechanical tolerances which must be followed during production of the printer itself, but also eliminates any problems of wear and tear and their effect on mechanical alignment during the product life of the individual printer. Periodic checks for alignment of the printhead carriage to the printer could be made and if alignment is not correct, a new pattern could be generated on the liquid crystal display 46 for realignment of the carriage.

Figure 6:
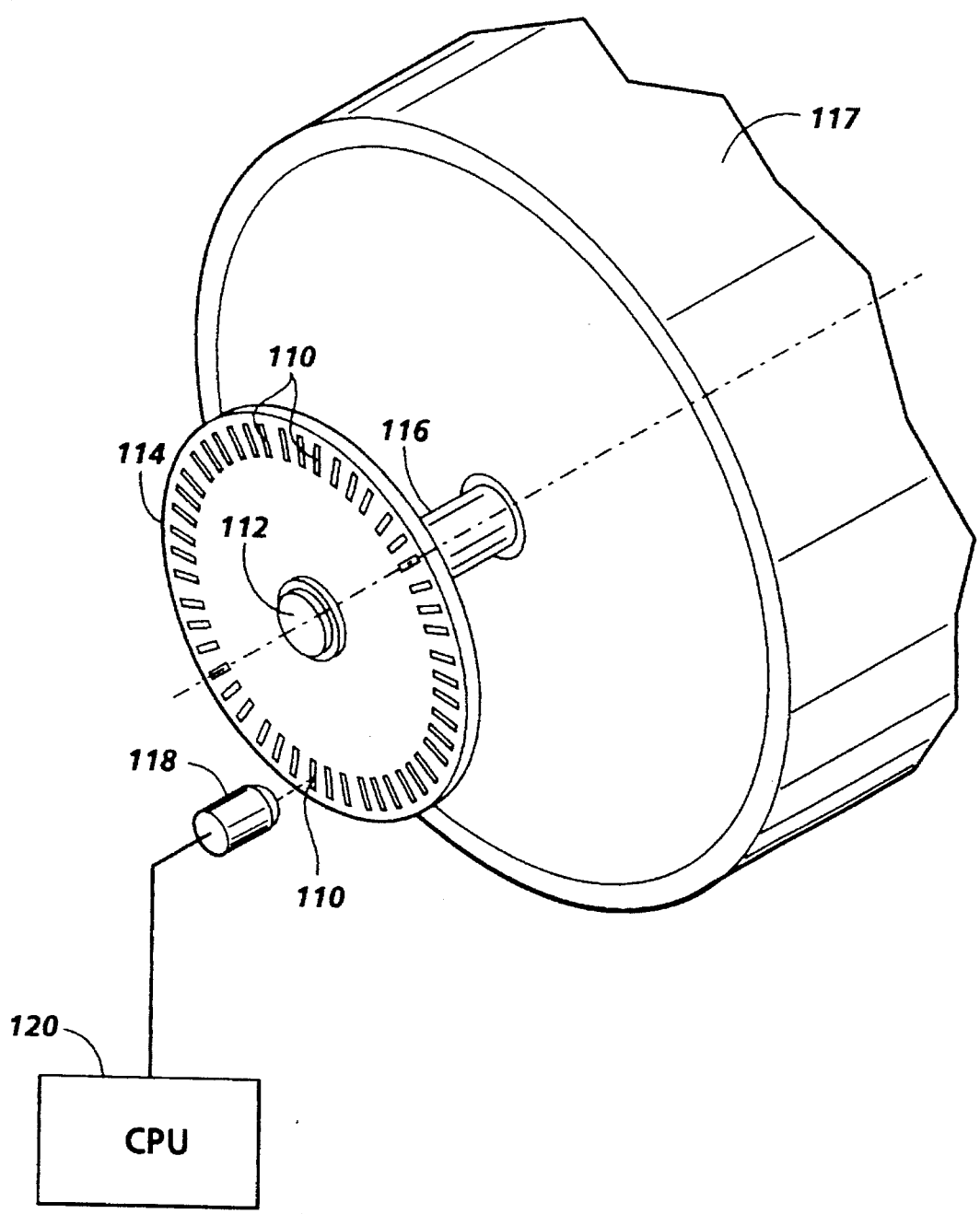
FIG. 6 is a schematic depiction of a programmable rotary encoder.

The programmable encoder is not limited to ink jet printers nor is it limited to encoders using linear strips. As illustrated in FIG. 6, the present invention is equally applicable to rotary encoders which use a rotating disk displaying a set of fiducial marks 110 arranged along a common track concentrically about a center 112 of a disk 114. The disk 114 is attached to a rotating shaft 116 which may, for instance, be coupled to a drum 117 having a photoconductive surface for use in an electrophotographic printing process of a xerographic printer. Such a disk for use in a single channel encoder is described in U.S. Pat. No. 5,206,645 the relevant portions of which are incorporated herein by reference. As previously described for the linear strip displayed on an LCD, an LCD would also be used in the embodiment of FIG. 6 to display the fiducial marks 110 for the disk 114. The disk 114 could include an infrared detector for receiving infrared signals carrying the necessary information to display the appropriate programmed arrangement of fiducial marks. The fiducial marks are sensed by a sensor 118 coupled to a central processing unit 120 which processes the signals generated by the sensor 118.

It is therefore, apparent that there has been provided in accordance with the present invention, a programmable encoder for determining the position of a moving component, such as a moving carriage in an ink jet printer. While the invention has been described in conjunction with a specific embodiment thereof, it is evident that many alternatives, modifications, and variations will be apparent to those skilled in the art. For instance, the present invention is not limited to printing machines, but can be used in any machine in which it is necessary to determine the position, velocity, or acceleration of a moving portion thereof. In addition, a second programmable display might be located between a first programmable display and the sensor to act as a shutter or stencil to generate a greater variety of displayed patterns. Accordingly, the present invention is intended to embrace all such alternatives, modifications, and variation that fall within the spirit and broad scope of the appended claims.

What is claimed is:

1. A programmable encoder comprising:
   an addressable display having a display input for receiving pattern signals to cause said addressable display to display a pattern formed according to the signals;
   a sensor spaced from said addressable display having a sensor output for transmitting sensor signals; and
   a controller having a controller input coupled to the sensor output, and a controller output with the controller input receiving the sensor signals and the controller output outputting control signals based on the sensor signals.

2. The programmable encoder of claim 1, further comprising a pattern generating circuit having a pattern generating circuit output coupled to the display input, said pattern generating circuit output carrying pattern signals.

3. The programmable encoder of claim 2, wherein said pattern generating circuit comprises a memory circuit storing a bitmap of pattern image data.

4. The programmable encoder of claim 3, wherein said memory circuit comprises a random access memory circuit.

5. The programmable encoder of claim 3, wherein the bitmap of pattern image data includes a plurality of lines equally spaced.

6. The programmable encoder of claim 3, wherein the bitmap of pattern image data includes a plurality of lines unequally spaced.

7. The programmable encoder of claim 3, wherein the bitmap of image data includes a plurality of lines having unequal widths.

8. The programmable encoder of claim 2, wherein said pattern generating circuit is programmable.

9. The programmable encoder of claim 8, wherein said pattern generating circuit comprises a central processing unit which generates a pattern according to a stored program of instructions.

10. The programmable encoder of claim 9, wherein said pattern generating circuit comprises a memory circuit storing a bitmap of pattern image data.

11. The programmable encoder of claim 10, wherein said memory circuit comprises a read only memory circuit.

12. The programmable encoder of claim 1, wherein said addressable display comprises a liquid crystal display.

13. The programmable encoder of claim 12, wherein said liquid crystal display comprises a dot-matrix display.

14. The programmable encoder of claim 12, wherein said liquid crystal display comprises a linear array liquid crystal display.

15. The programmable encoder of claim 1, further comprising a movable member spaced from said addressable display, said sensor attached to said movable member.

16. The programmable encoder of claim 1, further comprising a movable member spaced from said sensor, said addressable display attached to said movable member.

17. A method for controlling the motion of a movable member, comprising:
   displaying a pattern with an addressable display; scanning the pattern displayed on the addressable display with a sensor;
   generating signals according to the scanned pattern;
   generating a control signal based on the generated signals; and
   controlling the motion of the movable member with the control signal.

18. The method of claim 17, wherein said scanning step comprises moving the sensor with respect to the displayed pattern.

19. The method of claim 18, wherein said scanning step comprises moving the pattern with respect to the sensor.

20. The method of claim 19, wherein the pattern moves relative to the addressable display device which is held stationary.

21. The method of claim 17, wherein the pattern comprises a plurality of fiducial marks.

22. The method of claim 21, further comprising storing the pattern in a memory circuit.

23. The method of claim 22, wherein said storing step comprises storing the pattern in a random access memory circuit.

24. The method of claim 22, wherein said storing step comprises storing the pattern in a read only memory.

25. The method of claim 22, wherein said storing step comprises storing a pattern of bitmap image data.

26. The method of claim 25, wherein said storing step comprises storing a bitmap of image data having a plurality of lines equally spaced.

27. The method of claim 25, wherein sad storing step comprises storing a bitmap of image data having a plurality of lines unequally spaced.

28. The method of claim 25, wherein said storing step comprises storing a bitmap of image data having a plurality of lines having unequal widths.

29. The method of claim 17, wherein said displaying step comprises displaying the pattern on a liquid crystal display.

30. The method of claim 29, wherein said displaying step comprises displaying the pattern on a dot matrix liquid crystal display.

31. The method of claim 29, wherein said displaying step comprises displaying the pattern on a linear array liquid crystal display.

32. A printing apparatus comprising;
   a movable member; and
   a programmable encoder determining the position of said movable member, said programmable encoder having an addressable display, spaced from said movable member.

33. The printing apparatus of claim 32, wherein said movable member comprises a movable carriage having a printhead attached thereto.

34. The printing apparatus of claim 33, wherein said addressable display includes a display input, the display input receiving pattern signals to cause said addressable display to display a pattern formed according to the signals.

35. The printing apparatus of claim 34, wherein said programmable encoder comprises a sensor spaced from said addressable display, said sensor having a sensor output transmitting sensor signals.

36. The printing apparatus of claim 35, wherein said programmable encoder comprises a controller having a controller input coupled to the sensor output, and a controller output with the controller input receiving the sensor signals and the controller output transmitting control signals based on the sensor signals.

37. The printing apparatus of clam 36, wherein said programmable encoder comprises a pattern generating circuit having a pattern generating circuit output coupled to the display input, said pattern generating circuit output transmitting pattern signals.

38. The printing apparatus of claim 32, wherein said movable member comprises a photoconductive drum for a xerographic printer.

\* \* \* \* \*